(12) United States Patent
Ishii et al.

(10) Patent No.: US 7,690,256 B2
(45) Date of Patent: Apr. 6, 2010

(54) SENSING DEVICE

(75) Inventors: Takehito Ishii, Saitama (JP); Shunichi Wakamatsu, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 322 days.

(21) Appl. No.: 11/881,615

(22) Filed: Jul. 27, 2007

(65) Prior Publication Data

US 2008/0156099 A1  Jul. 3, 2008

(30) Foreign Application Priority Data

Jul. 31, 2006 (JP) .............................. 2006-208854

(51) Int. Cl.
  *H03B 5/38* (2006.01)
  *G01H 13/00* (2006.01)
  *G01H 3/08* (2006.01)
  *G01N 29/036* (2006.01)
(52) U.S. Cl. ..................................... 73/579; 331/116 R
(58) Field of Classification Search .................... 73/579; 331/116 R
  See application file for complete search history.

(56) References Cited

U.S. PATENT DOCUMENTS 5,177,994 A * 1/1993 Moriizumi et al. .......... 73/23.34

| | | | |
|---|---|---|---|
| 6,266,996 B1 * | 7/2001 | Livingston | 73/24.01 |
| 6,294,964 B1 * | 9/2001 | Satoh | 331/116 R |
| 2007/0089513 A1 * | 4/2007 | Rosenau et al. | 73/514.32 |
| 2008/0156097 A1 * | 7/2008 | Onishi et al. | 73/579 |

FOREIGN PATENT DOCUMENTS

JP  2001-083154  3/2001

* cited by examiner

*Primary Examiner*—Hezron Williams
*Assistant Examiner*—Rose M Miller
(74) *Attorney, Agent, or Firm*—Jordan and Hamburg LLP

(57) ABSTRACT

To provide a Colpitts oscillation circuit formed with a quartz resonator and a transistor amplifier circuit, which can secure sufficient negative resistance, obtain stable oscillation, negate the need for an amplitude control circuit, and realize stabilization against temperature variations. In order to solve the problem, a structure in which the impedance of a tuning circuit provided in a collector of the transistor exhibits inductivity at the oscillation frequency is provided. The impedance ratio at the oscillation frequency of a capacitor C2 connected between a base and an emitter to a capacitor C3 connected between the emitter and a ground, of the transistor is set at 3 to 1 or more. Furthermore, the impedance of capacity C2 connected between the base and the emitter at the oscillation frequency is set at 300 Ω or more. A bias resistance R1 connected between the collector and the base of the transistor is set at 3 kΩ or less. A temperature compensation diode D1 is inserted in series between the base and the ground (GND) between the transistor.

3 Claims, 13 Drawing Sheets

PRIOR ART

SENSING DEVICE

BACKGROUND OF THE INVENTION

1. Field of the Invention

The present invention relates to a sensing device which is provided with an adsorption layer for adsorbing a sensing target on an electrode surface of a piezoelectric resonator such as a quartz resonator, and detects and measures the sensing target based on variation in natural frequency of the quartz resonator caused by adsorption of the sensing target to the adsorption layer, especially to a Colpitts oscillation circuit formed with a quartz resonator and a transistor amplifier circuit.

2. Description of the Related Art

This kind of the sensing devices is commercially practical as a device which, for instance, combines a substance to be measured with the antibody to make an immune reaction with the substance to be measured, utilizing an antigen-antibody reaction as an immune reaction, and detects and measures the substance to be measured based on the degree of the reaction.

FIG. 10 shows a basic structure of a sensing device. An piezoelectric resonator, for instance, a quartz resonator 100 is structured by forming electrodes 102 and 103 on both surfaces of a quartz substrate 101, and is fixed in a receptacle 104. The electrodes 102 and 103 are connected to an oscillation circuit 107 through lead wires 105 and 106, and the oscillation circuit 107 oscillates at the natural frequency of the quartz resonator 100. The oscillation output of the oscillation circuit 107 is detected by a frequency counter 108 as a frequency signal, and the frequency of the frequency signal is displayed on a display 109. The antibody is applied to the surface of the electrode 102 which is one of the electrodes of the quartz resonator. The amount of adsorption of the substance to be measured on the antibody is measured as change in oscillation frequency of the oscillation circuit 107 by bringing the electrode 102 into contact with a solution containing the substance to be measured (refer to, for instance, Patent Document 1).

Here, the oscillation circuit 107 using the quartz resonator is structured as a Colpitts oscillation circuit or a Hartley oscillation circuit which can generally perform oscillation operation with a quartz resonator and an amplifier. As the amplifier, an analogue amplifier provided with a feedback circuit between an output and an input of an inverting logic element, or a transistor amplifier circuit with a transistor and a capacitor or a resistor is used.

[Patent Document 1] Japanese Patent Application Laid-open No. 2001-83154

SUMMARY OF THE INVENTION

A sensing device utilizing the change in natural frequency of a quartz resonator is able to measure a substance in a gas or in a liquid. Accordingly, in order to ensure a wide scope of application with one set of the device, it is preferable that the device can be used in both gas and liquid as a measuring medium for measuring a sensing target. For instance, a toxic substance such as dioxin, or sarin in the air can be measured, and dioxin or agricultural chemicals in a liquid can also be measured by the sensing device. Further, if this sensing device is structured so as to be used for measurement of epidemic markers contained in blood or urine, it will be a very useful device.

In such a case, when set as a circuit to oscillate a quartz resonator in a liquid, some inconvenience occurs when measuring, for instance, components in the air. That is, the amplitude of quartz resonator oscillation becomes great, resulting in secondary oscillation due to extreme smallness of viscosity of gases compared with that of liquids, and therefore the frequency becomes unstable. Conversely, when set as a circuit to oscillate the quartz resonator in the air, the amplitude level of the frequency signal when using in a liquid is considerably high compared with that in the air, and therefore, accurate frequency measurement can not be conducted in a signal processing unit at the following step.

This kind of problem would happen even in the case of using the device in a liquid. For instance, as for the measuring medium, viscosity is different between the case of water in a river and the case of liquid protein or serum. Therefore, if the circuit is adjusted to either one of the liquids, the amplitude of frequency signal of the quartz sensor in the other liquid differs greatly from the above case.

Thus, when the viscosity in a measuring medium (liquid) to conduct measurement of a sensing target differs, the amplitude of the frequency signal also differs, which causes a problem of limiting the scope of application of the measuring medium. For instance, it is difficult to build up a sensing device applicable for both gas and liquid. Furthermore, when the frequency signal from an oscillation circuit is digitally processed to measure the frequency, if the amplitude level of the frequency signal is out from a limited narrow range, the error in measurement can become great. Accordingly, when conducting a digital processing, it is difficult to widen the scope of application of the measuring medium especially, which brings another disadvantage.

As a sensing device to solve these disadvantages, a sensing device shown in FIG. 11 has already been proposed. In FIG. 11, the latter part of an oscillation circuit 2 for oscillating a quartz resonator 1 is connected to a first buffer amplifier 3, a lowpass filter 4, and a second buffer amplifier 5. An oscillation control circuit 6 for keeping the amplitude of the first buffer amplifier 3 at a predetermined value is provided between the output side of the first buffer amplifier 3 and the oscillation circuit 2.

The latter part of the second buffer amplifier 5 is connected to a measurement unit 7. The measurement unit 7 measures the output of the oscillation circuit 2, in more concretely, has a function to measure a signal relating to the frequency of an oscillation output of the buffer amplifier 5. The measurement unit 7 is provided with the function of obtaining a direct current signal, for instance, a direct voltage, corresponding to the frequency of, for instance, an oscillation output so as to obtain the adsorption amount of a sensing target from the difference between the direct current voltages before and after adsorption of the sensing target to the adsorption layer.

A concrete circuit structure for respective units will be shown in FIG. 12. The oscillation circuit 2 is structured as a Colpitts type oscillation circuit, and the quartz resonator 1 is connected to a base of a transistor 21 as an amplifying element via a capacitor 22. In addition, a series circuit of capacitors 23 and 24 which are divided capacitive components is connected between the base of the transistor 21 and a ground, and a middle point of the capacitors 23 and 24 is connected to an emitter of the transistor 21. A feedback resistor 25 is connected between the emitter of the transistor 21 and the ground, and a collector is connected to a supply source Vc via a parallel circuit of an inductor 26 and a capacitor 27.

A bleeder resistor 28 is connected between the supply source Vc and the base of the transistor 21. It should be noted that an output terminal Vo of the oscillation circuit 2 is taken out from the collector. The oscillation circuit 2 and the first buffer amplifier 3, and the first buffer amplifier 3 and the lowpass filter 4 are connected via capacitors 30 and 40 respectively, and also a capacitor 50 is connected to the output terminal of the second buffer amplifier 5. The first buffer amplifier 3 and the second buffer amplifier 5 are structured by using transistors 31 and 51 respectively, and both take out the outputs from emitters. 32 to 34, and 52 to 54 are resistors.

The amplitude control circuit 6 is provided with a series circuit consisting of a resistor 61 which is connected between the base of the transistor 21 of the oscillation circuit 2 and the ground, and a transistor 62. The resistor 61 is provided on the transistor 21 side, and at the same time a collector and an emitter of the transistor 62 are connected to the resistor 61 and the ground respectively. The resistor 61 is also a portion of the oscillation circuit 2, and is provided as a bleeder resistor.

A resistor 63 and a diode 64 are connected between the output terminal of the first buffer amplifier and the base of the above-described transistor 62 from the output terminal side thereof. A resistor 65 is connected between a middle point of the resistor 63 and the diode 64, and the ground. A resistor 66 is connected between the middle point and the supply source Vc.

In this structure, the amplitude control circuit 6 performs the following operation when the oscillation circuit 2 is conducting oscillation operation. That is, an oscillation output of the first buffer amplifier 3 is rectified with the diode 64, and the rectified output is supplied to the base of the transistor 62. Accordingly, if the amplitude of the oscillation output is great, the base potential of the transistor 62 becomes great, and the resistor value between the collector and the emitter of the transistor 62 becomes small. As a result, the base potential of the transistor 21 of the oscillation circuit 2 becomes small, and the oscillation output of the oscillation circuit 2, in detail, the amplitude of the oscillation output of the transistor 21 shows the tendency to become small. Conversely, when the amplitude of the oscillation output of the first buffer amplifier 3 is small, the base potential of the transistor 62 becomes small. Accordingly, the base potential of the transistor 21 of the oscillation circuit 2 becomes great, and the amplitude of the oscillation output of the oscillation circuit 2 shows the tendency to become great.

Since the amplitude of an oscillation output is controlled in this manner, in other words, since the amplification degree of the transistor 21 that is an amplifying element is controlled, the amplitude of the oscillation output of the first buffer amplifier 3 is controlled to be kept at a value (determined value) determined by a circuit constant. Accordingly, an oscillation output having a nearly constant amplitude is routed into the measurement unit 7.

It is also possible to use the sensing device to detect a specific substance in a gas, and when the sensing device is used for such a purpose, the oscillation output of the quartz resonator 1 is measured in the gas, for instance, in the air. Since gas has a low viscosity compared with that of a liquid, the amplitude of the quartz resonator 1 tends to become great. However, since the amplitude control is acted thereon, the amplitude of the oscillation output routed into the measurement unit 7 equalizes when liquid is taken as the measuring medium. Furthermore, even when the measuring medium is liquid, if a highly viscous liquid is used as the measuring medium, in other words, when this sensing device is used to detect, for instance, epidemic markers in blood, although the amplitude of the quartz resonator 1 tends to become small, the amplitude of the oscillation output inputted into the measurement unit 7 is the same as that in the previous case also due to the above-described amplitude control function.

Accordingly, since the amplitude of the oscillation output of the oscillation circuit 2 is controlled to be set at a fixed value, it oscillates at a predetermined amplitude even when the measuring medium that determines the concentration of a sensing target or detects the presence or absence of the sensing target is liquid or gas, or a liquid of any viscosities.

In such a sensing device described above, the oscillation circuit is required to have functions to perform stable oscillation at a high frequency (several MHz to several tens MHz) as well as to control the amplitude of the oscillation output to be a fixed value, and is required to have stable frequency characteristics toward temperature variations.

For instance, when a substance to be measured is combined with an antibody on the surface of an electrode of the quartz resonator, the equivalent series resistance of the quartz resonator reaches several hundreds Ω. In other words, if there is no negative resistance enough to make up the loss in the oscillation circuit portion, oscillation is suspended, and it becomes impossible to measure the amount of frequency variation due to antigen-antibody reaction. Accordingly, the oscillation circuit is required to have a negative resistance high enough as several hundreds Ω or more at an oscillation frequency band.

FIG. 13 shows the frequency characteristic of a negative resistance in the circuits in FIGS. 11 and 12 (assumed to be an oscillation frequency of 30.8 MHz). In these circuits, although the negative resistance of the oscillation circuit side is made up by the amplitude control circuit based on the loss of the quartz resonator (actually, based on the amplitude of an oscillation output after the first buffer amplifier 3), a sufficiently high negative resistance has not been obtained.

Furthermore, it requires the oscillation control circuit 6 which controls the degree of amplification of an amplifying element in the oscillation circuit so that the amplitude of the oscillation output of the oscillation circuit is a predetermined value. However, since addition of the amplitude control circuit 6 causes increase of circuit scale, which causes the problem of bringing it impossible to miniaturize a circuit or to increase the cost of manufacturing.

An object of the present invention is to provide a sensing device which can exhibit high negative resistance required to the sensing device, realize down sizing of the sensing device and reduction of manufacturing costs by making the amplitude control circuit unnecessary, and further realize stable oscillation toward temperature variations.

The sensing device of the present invention includes:

a piezoelectric resonator provided with electrodes on both surfaces of a piezoelectric substrate and an adsorption layer for adsorbing a sensing target on the surface of one electrode;

a Colpitts oscillation circuit including the piezoelectric resonator and a transistor amplifier circuit;

a means for determining the variation of natural frequency of a quartz resonator created by adsorption of the sensing target to the adsorption layer based on the frequency signal outputted from the Colpitts oscillation circuit; and a tuning circuit provided on the output side of the above-described transistor amplifier circuit and the impedance thereof has inductivity at the oscillation frequency.

As a concrete example of the present invention, the following structure can be cited. That is, the present invention includes:

a first capacitive component connected between a base and an emitter of the transistor of the above-described transistor amplifier circuit; and a second capacitive component connected between the emitter and a ground of the above-described transistor, in which the ratio of the impedance of the first capacitive component at the above-described oscillation frequency to the impedance of the above-described second capacitive component at the oscillation frequency of the above-described Colpitts oscillation circuit is 3 or more, and the impedance of the first capacitive component at the above-described oscillation frequency is 300 Ω or more.

A bias resistance connected between the collector and the base of the transistor in the above-described transistor amplifier circuit is preferably 3 kΩ or less. It is preferable that a temperature compensation diode is connected in series to the resistor connected between the base and the ground of the transistor of the above-described transistor amplifier circuit.

As described above, according to the present invention, by optimizing the constant of the Colpitts oscillation circuit formed with a quartz resonator and a transistor amplifier circuit, it is possible to obtain the stable oscillation by securing a high negative resistance required by the sensing device, and achieve reduction in size and reduction in manufacturing costs of the sensing device by making the amplitude control circuit unnecessary. Furthermore, it can realize stable oscillation toward temperature variations.

DETAILED DESCRIPTION OF THE PREFERRED EMBODIMENT(S)

Embodiment 1

Figure 1:
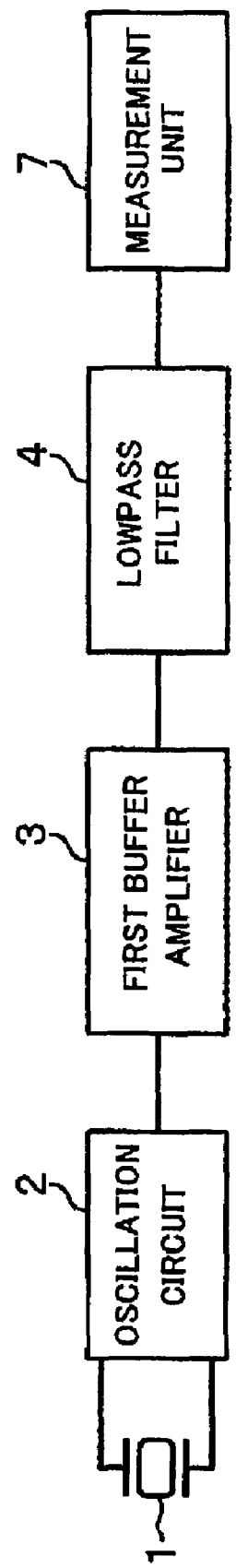
FIG. 1 is a block diagram of a sensing device showing an embodiment of the present invention.
Figure 2:
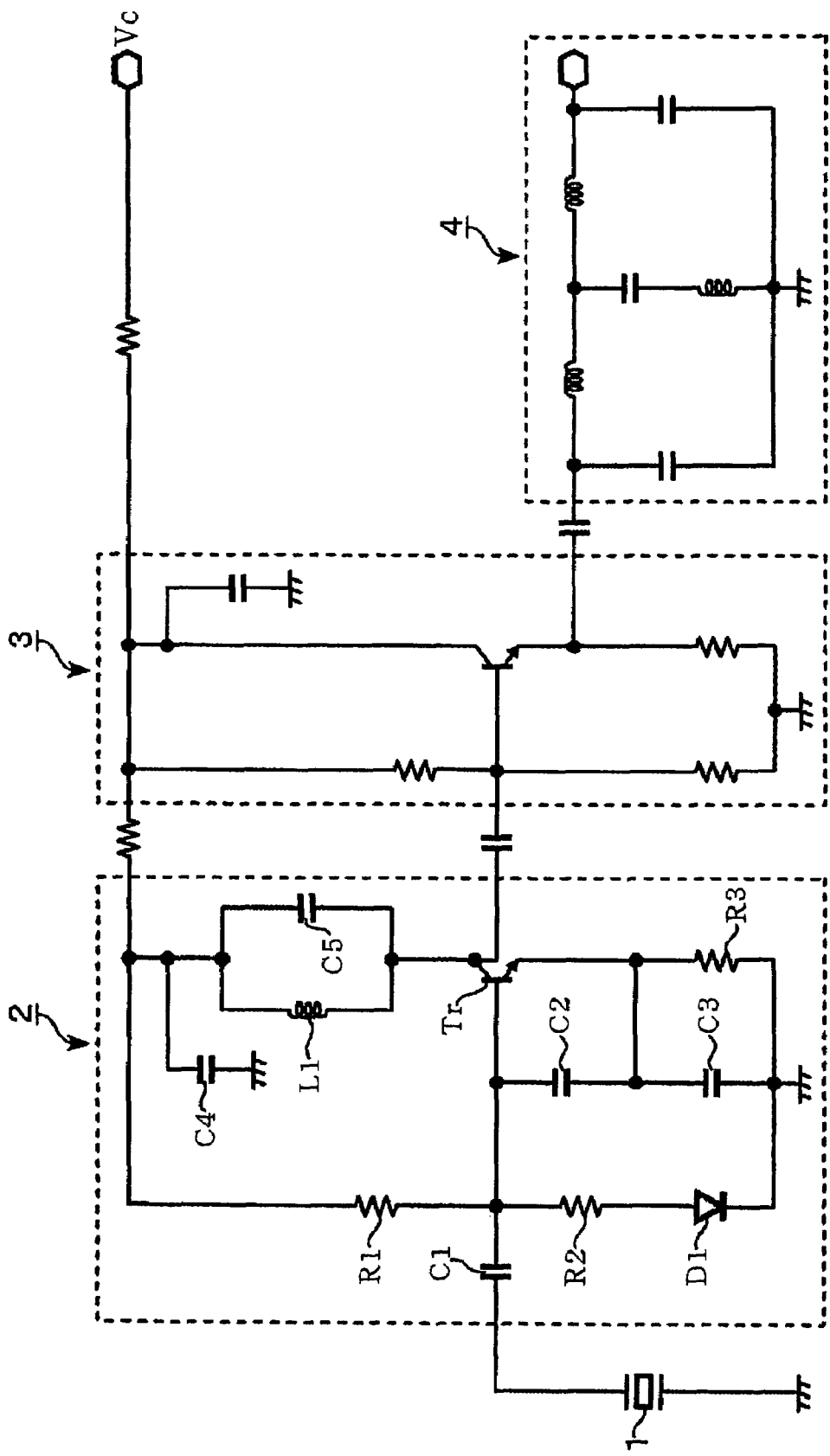
FIG. 2 is a block diagram of the oscillation circuit in FIG. 1.
Figure 11:
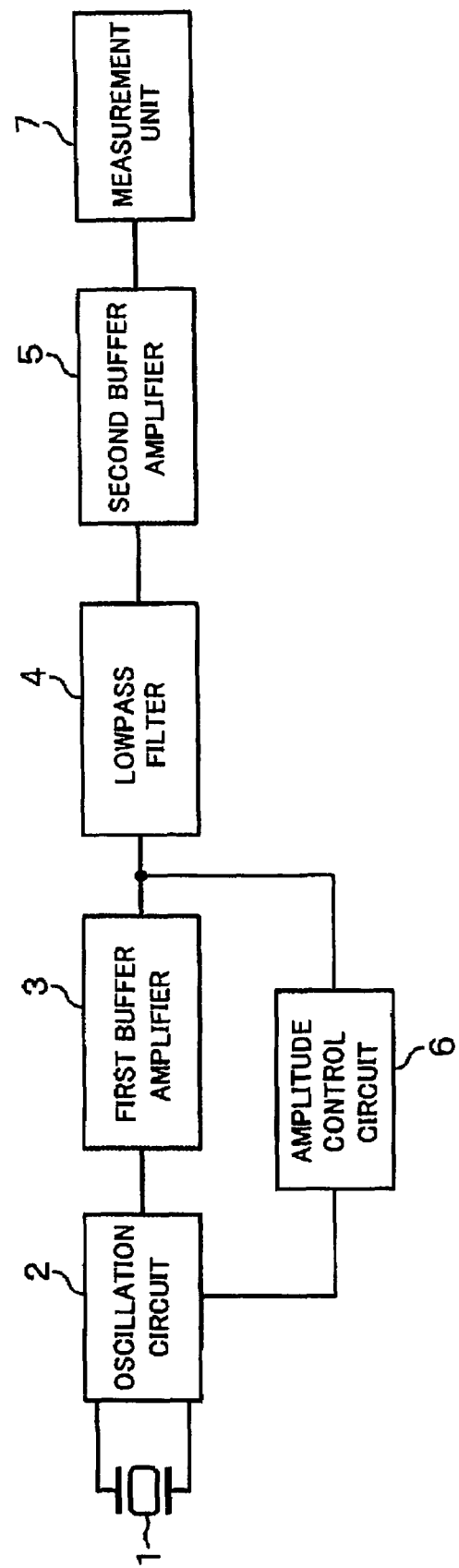
FIG. 11 is a block diagram of a conventional sensing device.
Figure 12:
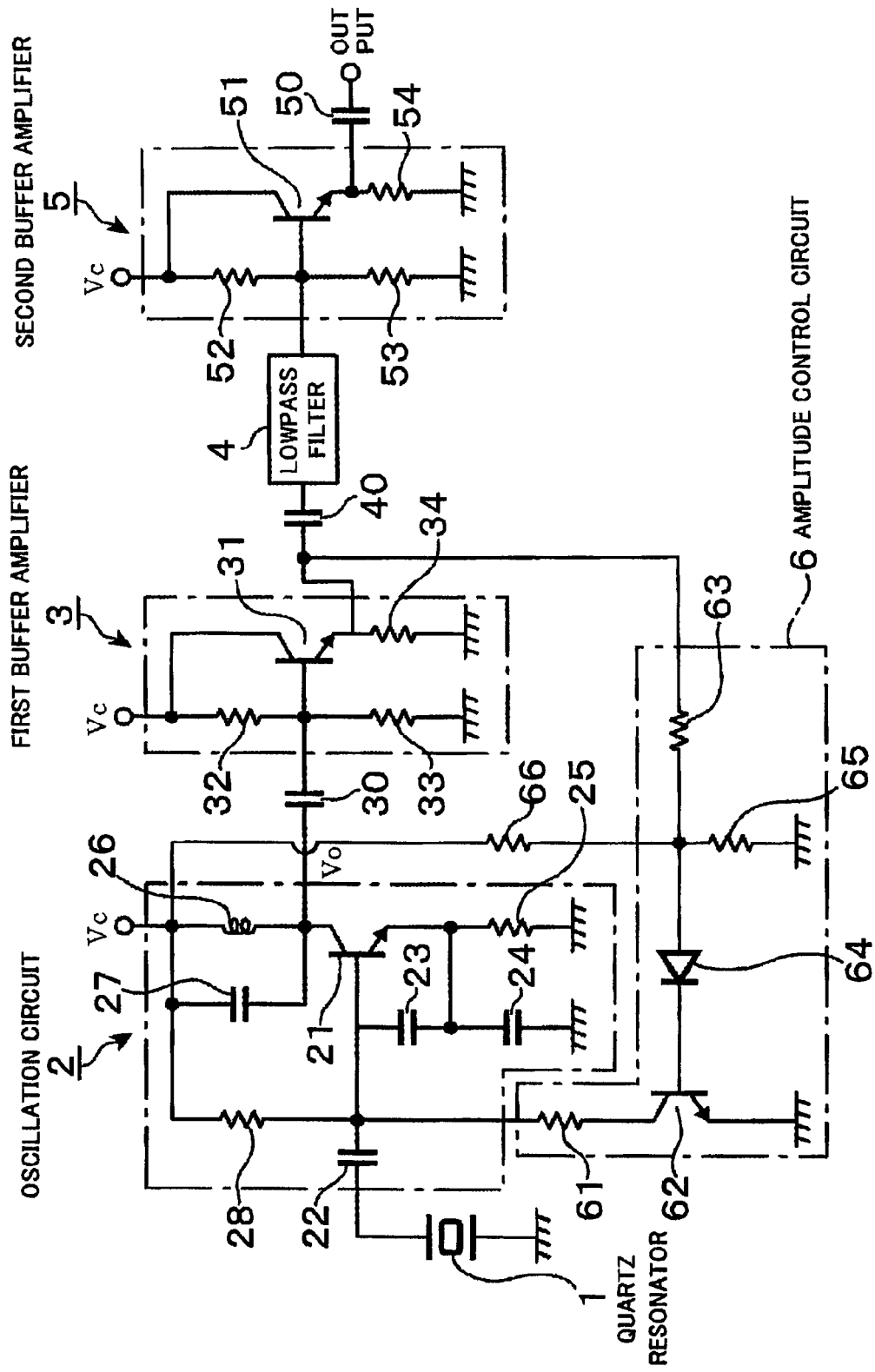
FIG. 12 is a block diagram of a conventional concrete circuit.
Figure 13:
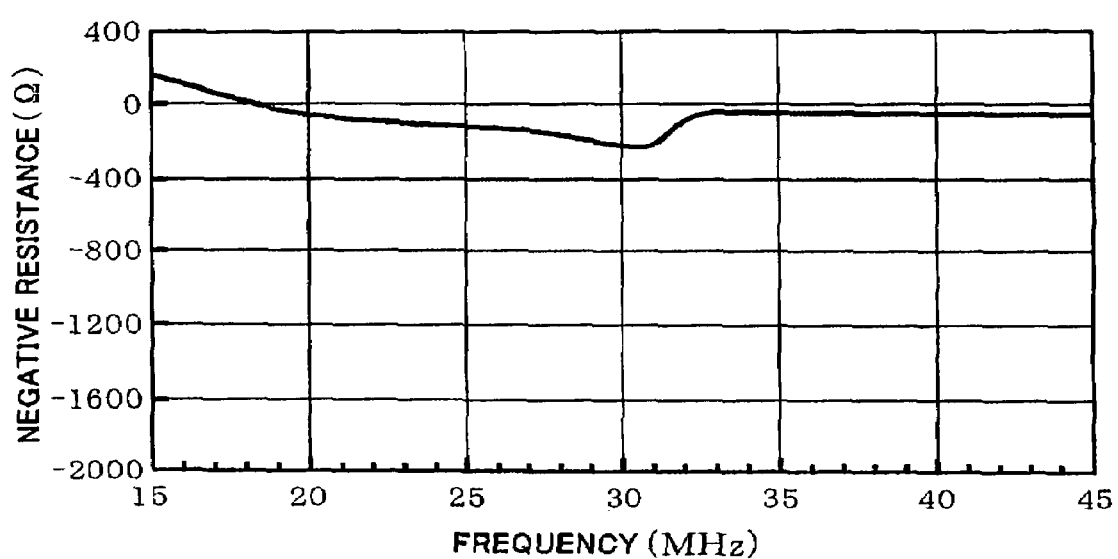
FIG. 13 shows a conventional negative resistance characteristic.

FIG. 1 is a block diagram of a sensing device showing an embodiment of the present invention. The difference from FIG. 11 is the structure omitting an amplitude control circuit 6 and a second buffer amplifier 5. FIG. 2 is a circuit diagram showing the structures of respective blocks in FIG. 1 in detail.

Firstly, in the present embodiment, the sensing device having an oscillation frequency of 30.8 MHz is assumed. In this oscillation frequency, the impedance of a tuning circuit connected to the output unit of an oscillation amplifier element of a Colpitts oscillation circuit 2 is set at a value having inductivity in the oscillation frequency. In more specific, a tuning circuit 20 composed of a parallel circuit of an inductor L1 and a capacitor C5 is provided between a collector of a transistor Tr (BJT-NPN) and a supply source Vc. The inductor L1 and the capacitor C5 are set at 4.7 uH and 3 pF respectively, so that they are composed as a tuning circuit exhibiting inductivity in the oscillation frequency.

Figure 3:
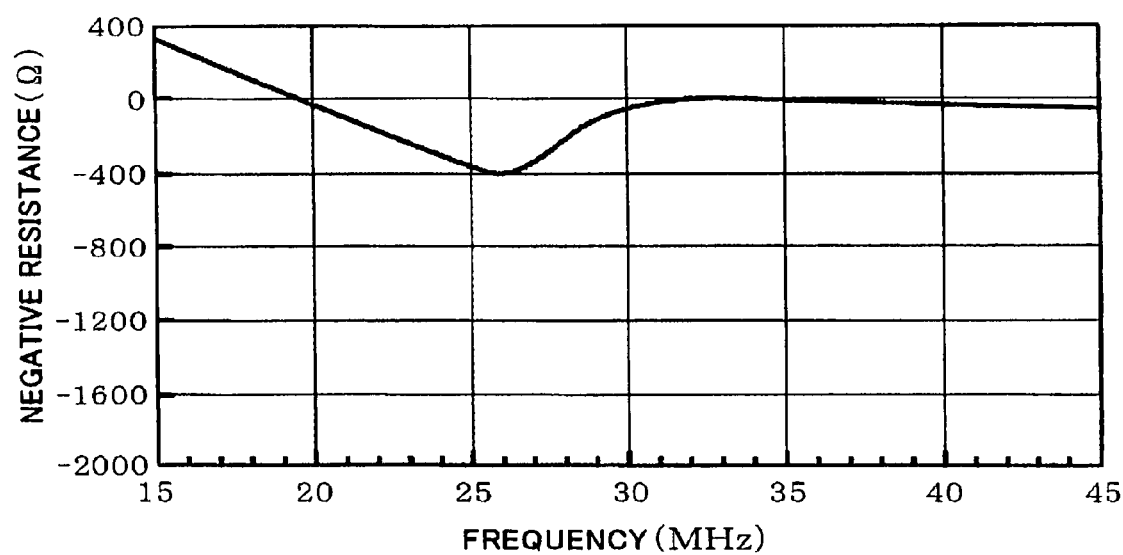
FIG. 3 is a negative resistance characteristic of an oscillation circuit in which the resonance frequency of a tuning circuit is adjusted to the oscillation frequency.

FIG. 3 shows a negative resistance characteristic at the time of adjusting a resonance frequency of the inductor L1 and the capacitor C5 in the tuning circuit 20 to the oscillation frequency (30.8 MHz). The peak of the negative resistance at this time is shifted towards a lower frequency side from the oscillation frequency, and a high negative resistance cannot be obtained at the oscillation frequency, and therefore, impossibility of oscillation, or suspension of oscillation is supposed. The causes of this frequency shift are assumed that the operation of the tuning circuit 20 is influenced by a capacitor C2 for capacity division which is a first capacitive component, a capacitor C3 for capacity division which is a second capacitive component, electrode capacity of the quartz resonator, and stray capacity.

Accordingly, in the present embodiment, it is structured in a manner that the resonance frequency of the inductor L1 and the capacitor C5 in the tuning circuit is set at higher than the oscillation frequency (keeping inductivity), and the peak of the negative resistance is made consistent with the oscillation frequency. Therefore, a stable oscillation can be obtained.

Embodiment 2

Although the peak of the negative resistance in FIG. 3 is about 400 Ω, a method of increasing the negative resistance will be explained hereinafter giving an example. In the present embodiment, by limiting the capacity ratio of a pair of capacitors C2 and C3 for capacity division, and the impedance at the oscillation frequency in a Colpitts oscillation circuit in which the tuning circuit 20 in Embodiment 1 is made inductive, improvement of the negative resistance is attempted. In specific, the respective capacity of the capacitor C2 connected between a base and an emitter of the transistor Tr as an amplifying element for oscillation, and the capacitor C3 connected between the emitter and a ground (GND) are determined as follows. The ratio of the impedance at the oscillation frequency of the capacitor C2 to the impedance at the oscillation frequency, for instance, 30.8 MHz of the capacitor C3 is set at 3 or more. In other words, the ratio of the capacity of the capacitor C2 to the capacity of the capacitor C3 is ⅓ or less, and the impedance of the capacitor C2 connected between the emitter and the base at the oscillation frequency is set at 300 Ω or more. For instance, the capacity of the capacitor C2 is set at 12 pF and the capacity of the capacitor C3 is set at 68 pF. Note that in the following description, the "C" of capacitor C is also used to express the capacity of a capacitor, for convenience' sake.

Figure 4:
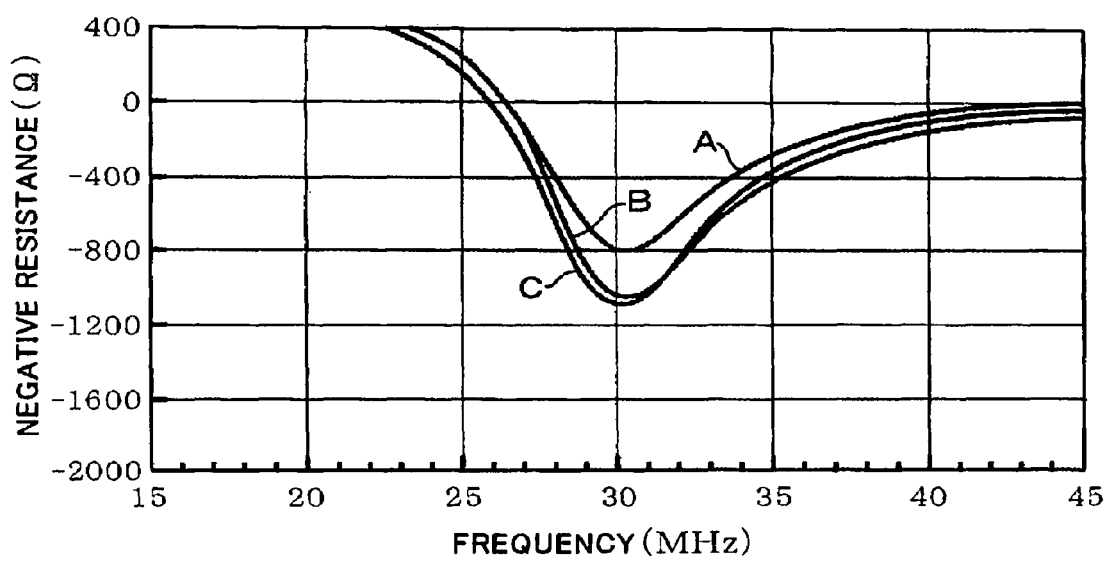
FIG. 4 shows negative resistance characteristics of the oscillation circuit in which the tuning circuit is made inductive.

FIG. 4 shows negative resistance characteristics when the ratio of the capacity C2 to the capacity C3 is varied in the Colpitts oscillation circuit in which the above-described tuning circuit is made inductive. Note that the capacitor C2 has an impedance of 300 Ω at the oscillation frequency, and the resistance R1 is 3 kΩ as the test conditions at this time.

In the figure, the characteristic A is the case of C2/C3=½, the characteristic B is C2/C3=⅓, and the characteristic C is C2/C3=¼. In order to obtain a negative characteristic of 1 kΩ or more at the oscillation frequency from these characteristics, the characteristic A is short of negative resistance. In the characteristics B and C, the negative resistance is sufficiently high, in other words, by making C2/C3 equal to ⅓ or less, a sufficiently negative resistance can be obtained.

Figure 5:
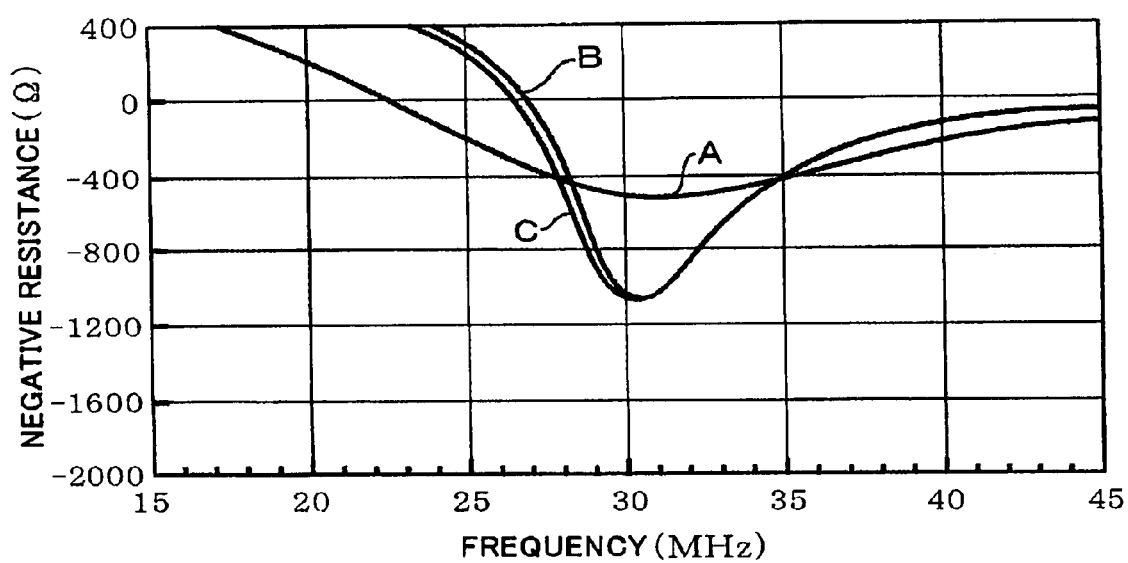
FIG. 5 shows negative resistance characteristics when the tuning circuit is made inductive and the impedance of a capacitor C2 is varied.

FIG. 5 shows negative resistance characteristics when the impedance of the capacitor C2 is varied in the Colpitts oscillation circuit in which the above-described tuning circuit is made inductive. Note that C2/C3=⅓, and the resistance R1 is 3 kΩ as the test conditions at this time.

In the figure, the characteristic A has the impedance of the capacitor C2 at the oscillation frequency of 200 Ω, the characteristic B has 300 Ω, and the characteristic C has 400 Ω. In order to obtain a negative characteristic of 1 kΩ or more at the oscillation frequency from these characteristics, the characteristic A is short of negative resistance. In the characteristics B and C, the negative resistance is sufficiently high, in other words, by setting the impedance of the capacitor C2 to be 300 Ω or more, a sufficiently negative resistance can be obtained.

From the above, in the present embodiment, by setting the ratio of the impedance of the capacitor C2 at the oscillation frequency to the impedance of the capacitor C3 at the oscillation frequency, for instance 30.8 MHz, to be at 3 or more, and the impedance at the oscillation frequency of the capacitor C2 to be 300 Ω or more, a sufficiently high negative resistance characteristic can be obtained. By obtaining such a high negative resistance, it becomes possible to reduce the number of the conventional amplitude control circuits.

Figure 6:
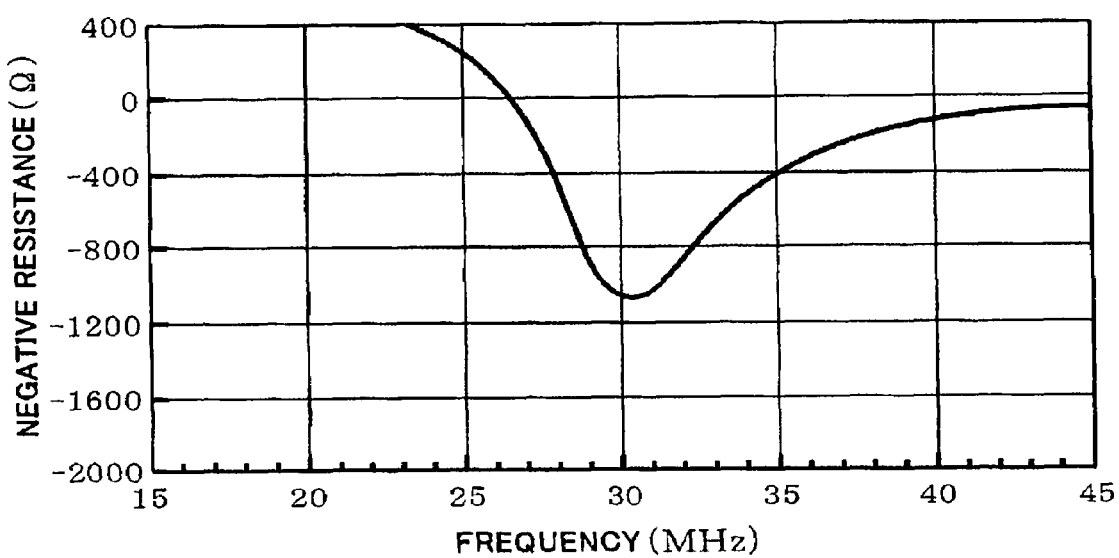
FIG. 6 is a negative resistance characteristic when the capacity ratio of the capacitor C2 to the capacitor C3 is made to be ⅓, and the impedance of the oscillation frequency of the capacitor C2 is 300 Ω.

FIG. 6 shows a negative resistance characteristic in which the impedance ratio of the capacity C2 to the capacity C3 at the oscillation frequency is set at 3/1, and the impedance of the capacity C2 connected between the emitter and the base at the oscillation frequency is set to be 300 Ω.

Figure 7:
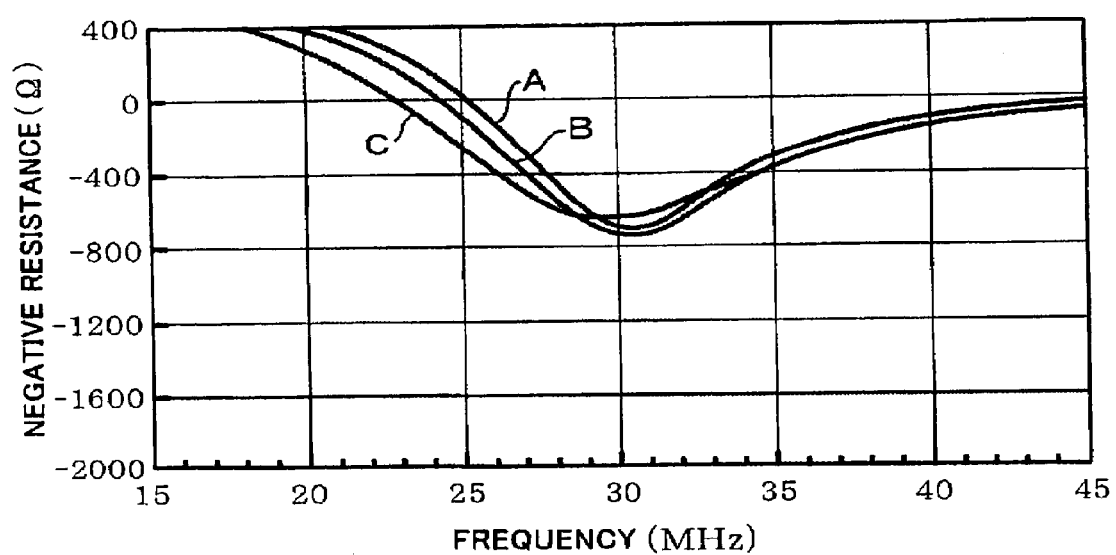
FIG. 7 shows negative resistance characteristics when the tuning circuit is made inductive and the impedance of the capacitor C2 is varied.
Figure 8:
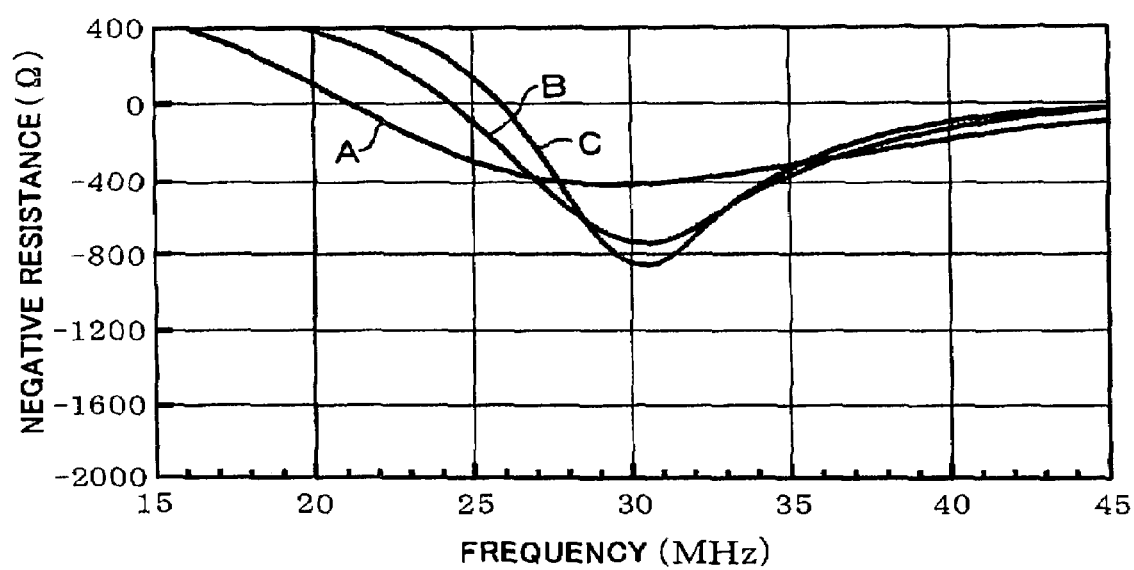
FIG. 8 shows negative resistance characteristics when the capacity ratio of the capacitor C2 to the capacitor C3 is made to be ⅓, and the impedance of the oscillation frequency of the capacitor C2 is 300 Ω.

In the test condition for examining the characteristics in FIG. 4 and FIG. 5, though the resistance R1 is set to be 3 kΩ, the results of examining the negative resistance at the case of setting the resistance R1 to be 4 kΩ are shown in FIG. 7 and FIG. 8. They are examined under completely the same conditions except varying the resistance R1, FIG. 7 corresponds to the test result in FIG. 4 and FIG. 8 corresponds to the test result in FIG. 5. Even when the resistance R1 is set to be 4 kΩ, though the negative resistance shows the same tendency as the case of setting the resistance R1 to be 3 kΩ, the negative resistance value at the oscillation frequency becomes somewhat smaller. It is understood from this result that the value of the resistance R1 affects the negative resistance. Therefore, in order to obtain a high negative resistance, it is necessary to make the value of the resistance R1 more appropriate, and the followings are embodiments in which the correction of the resistance value has been attempted.

Embodiment 3

In the present embodiment, by making the tuning circuit inductive as in Embodiment 1, and by setting the bias resistance connected between the collector and the base of an amplifying element for oscillation to be 3 kΩ or less in a Colpitts oscillation circuit in which the capacitance ratio of the capacitors C2 and C3 and the impedance of the capacitor C2 are limited as in Embodiment 2, reduction of the negative resistance is prevented. For instance, the bias resistance R1 in FIG. 2 is set to 1.2 kΩ.

Figure 9:
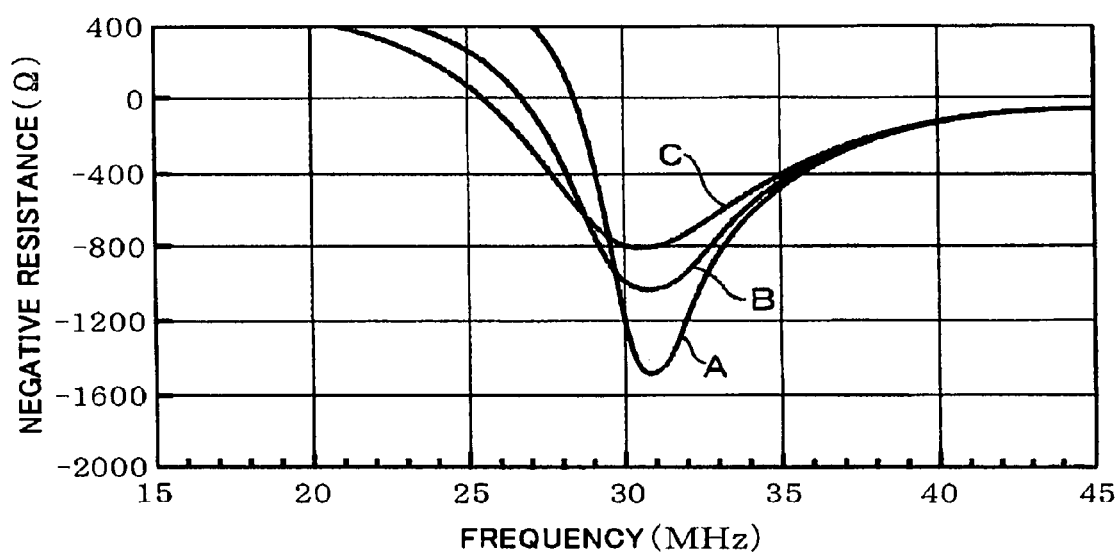
FIG. 9 shows negative resistance characteristics when a bias resistance R1 is varied.
Figure 10:
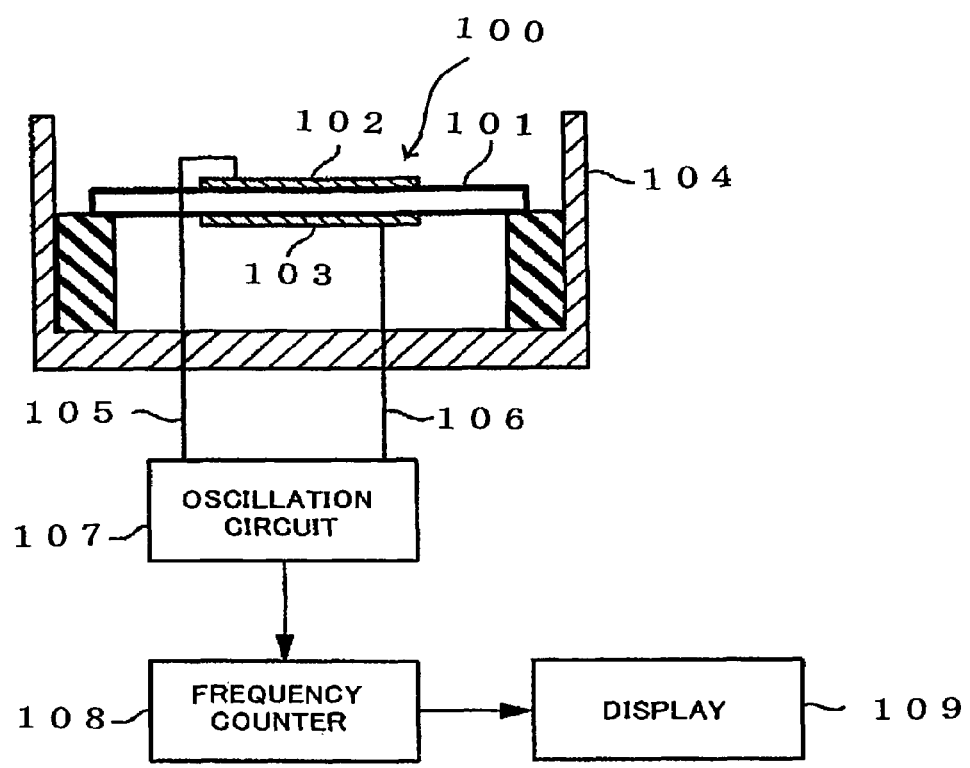
FIG. 10 is a basic diagram of the sensing device.

FIG. 9 shows a negative resistance characteristic when the bias resistance R1 is varied. As the test conditions at this time, the capacitor C2 has an impedance of 300 Ω at the oscillation frequency, and C2/C3=⅓.

In the figure, the characteristic A is the case of R1=2 kΩ, the characteristic B is R1=3 kΩ, and the characteristic C is R1=4 kΩ. In order to obtain a negative characteristic of 1 kΩ or more at the oscillation frequency from the characteristic, the characteristic C is short of negative resistance. In the characteristics A and B, the negative resistance is sufficiently high, in other words, by adjusting R1 to be equal to 3 kΩ or less, a sufficiently negative resistance can be obtained.

Embodiment 4

In the conventional circuit, since there was no compensation for temperature stability, the bias voltage of the amplifying element for oscillation is fluctuated by ambient air temperature as well as oscillation frequency, and therefore, temperature stabilization capability as a sensing device has been insufficient.

In order to improve the above, the present embodiment takes a structure having a diode D1 for temperature compensation to compensate bias fluctuation of the amplifying element for oscillation caused by fluctuation of the ambient air temperature inserted between the base and the ground (GND) of a transistor serving as an amplifying element for oscillation.

The temperature compensation function of the diode D1 utilizes fluctuation of the forward voltage caused by temperature, which makes it possible to obtain a desired temperature-voltage characteristic by connecting a plurality of diodes 1 in series, for instance, to obtain the function of a thermistor as a temperature sensitive element exhibiting the similar function.

(Modification)

As for the respective embodiments described above, it is possible to establish a structure in which a negative resistance is enhanced more by suitably combining the embodiments 2 through 4, and a structure to obtain stabilized oscillation operation.

In addition, as for a buffer amplifying unit, it is possible to establish a structure in which a plurality of the buffer amplifying units are used according to desired isolation between the oscillation circuit unit and the measurement unit.

What is claimed is:
1. A sensing device, comprising:
   a piezoelectric resonator provided with electrodes on both surfaces of a piezoelectric substrate and an adsorption layer for adsorbing a sensing target on the surface of one electrode;
   a Colpitts oscillation circuit including the piezoelectric resonator and a transistor amplifier circuit;
   a means for determining the variation of natural frequency of the piezoelectric resonator created by adsorption of the sensing target to the adsorption layer based on the frequency signal outputted from the Colpitts oscillation circuit;
   a tuning circuit provided on the output side of said transistor amplifier circuit and the impedance thereof has inductivity at the oscillation frequency;
   a first capacitive component connected between a base and an emitter of the transistor of said transistor amplifier circuit; and
   a second capacitive component connected between the emitter and a around of said transistor,
   wherein the ratio of the impedance of the first capacitive component at the oscillation frequency to the impedance of said second capacitive component at the oscillation frequency of the Colpitts oscillation circuit is 3 or more, and the impedance of the first capacitive component at the oscillation frequency is 300 Ω or more.

2. The sensing device according to claim 1, wherein a bias resistance connected between a collector and the base of the transistor of said transistor amplifier circuit is 3 kΩ or less.

3. A sensing device, comprising:
- a piezoelectric resonator provided with electrodes on both surfaces of a piezoelectric substrate and an adsorption layer for adsorbing a sensing target on the surface of one electrode;
- a Colpitts oscillation circuit including the piezoelectric resonator and a transistor amplifier circuit;
- a means for determining the variation of natural frequency of the piezoelectric resonator created by adsorption of the sensing target to the adsorption layer based on the frequency signal outputted from the Colpitts oscillation circuit;
- a tuning circuit provided on the output side of said transistor amplifier circuit and the impedance thereof has inductivity at the oscillation frequency; and
- a temperature compensation diode connected in series to a resistor connected between the base and the ground of the transistor of said transistor amplifier circuit.

* * * * *